US007187172B2

(12) United States Patent
Bielmeier et al.

(10) Patent No.: US 7,187,172 B2
(45) Date of Patent: Mar. 6, 2007

(54) METHOD FOR CONTROLLING AN RF TRANSMISSION DEVICE, AND MR APPARATUS AND RF DEVICE FOR IMPLEMENTING THE METHOD

(75) Inventors: Wolfgang Bielmeier, Nürnberg (DE); Klaus Ludwig, Nürnberg (DE); Volker Schnetter, Coburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/358,481

(22) Filed: Feb. 21, 2006

(65) Prior Publication Data

US 2006/0197528 A1    Sep. 7, 2006

(30) Foreign Application Priority Data

Feb. 21, 2005    (DE)    ............ 10 2005 007 895

(51) Int. Cl.
*G01V 3/00*    (2006.01)
(52) U.S. Cl. .................... 324/314; 324/318
(58) Field of Classification Search ............ 324/314, 324/318, 322, 307, 309
See application file for complete search history.

(56) References Cited

U.S. PATENT DOCUMENTS

| 6,426,623 | B1* | 7/2002 | Bernstein ............... 324/314 |
| 6,759,847 | B2 | 7/2004 | Brinker et al. |
| 6,762,605 | B2 | 7/2004 | Brinker et al. |
| 6,841,999 | B2* | 1/2005 | Arneth et al. ........... 324/309 |
| 7,030,615 | B2* | 4/2006 | Gortler ................... 324/318 |
| 7,075,301 | B2* | 7/2006 | Zhu ........................ 324/318 |
| 2003/0098687 | A1 | 5/2003 | Arneth et al. |
| 2005/0197077 | A1* | 9/2005 | Bielmeier et al. ....... 455/115.1 |

FOREIGN PATENT DOCUMENTS

WO    WO 2005/001502    1/2005

OTHER PUBLICATIONS

"Specific Absorption Rates and Induced Current Densities for an Anatomy-Based Model of the Human for Exposure to Time-Varying Magnetic Fields of MRI," Gandhi et al, Magnetic Resonance In Medicine, vol 41 (1999) pp. 816-823.

* cited by examiner

*Primary Examiner*—Louis M. Arana
(74) *Attorney, Agent, or Firm*—Schiff Hardin LLP

(57) ABSTRACT

In a method for controlling a radio-frequency device, and a magnetic resonance tomography system and a radio-frequency control device wherein the method is implemented, the RF device of a magnetic resonance tomography system is emitted during a magnetic resonance measurement of an examination subject that is moving relative to the transmission field of the RF device. The RF device emits RF pulses at chronological intervals, and measurement values are measured at chronological intervals. At chronological intervals, position values are determined that represent a current position of the examination subject relative to the transmission field. On the basis of the measurement values and the position values, exposure values are determined that represent a physiological degree of effectiveness that the RF pulses have on the subject exposed to the RF pulses. Based on a multiplicity of exposure values, exposure control values are respectively formed. The RF device is limited in its functioning if an exposure control value reaches or exceeds an exposure limit value.

10 Claims, 3 Drawing Sheets

METHOD FOR CONTROLLING AN RF TRANSMISSION DEVICE, AND MR APPARATUS AND RF DEVICE FOR IMPLEMENTING THE METHOD

BACKGROUND OF THE INVENTION

1. Field of the Invention

The present invention relates to a method for controlling a radio-frequency device for a magnetic resonance tomography system, as well as to a magnetic resonance tomography system having such a radio-frequency device, and to a corresponding radio-frequency (RF) control device for executing such a method.

2. Description of the Prior Art

In the field of medicine, in recent years an imaging based on modality, detection and measurement of the nuclear spins of protons in a region of the body. The imaging is essentially carried out in three steps. First, a strong, stable, homogenous magnetic field is generated around the body region, producing a stable (aligned) orientation of the protons in the relevant bodily region. This stable orientation is then altered by supplying electromagnetic RF energy. Thirdly, this energy stimulation is terminated, and the nuclear resonance signals that have arisen in the body are measured using suitable reception coils in order to obtain information about the tissue in this part of the body. A system for carrying out an imaging method of this sort is also known as a magnetic resonance tomography system.

A magnetic resonance tomography system has a large number of components that operate together, each of which requires the use of modem, expensive-technologies. A central component of a magnetic resonance tomography system, to which the present invention relates, is the RF device. This device is responsible in particular for producing the RF pulses that are to be radiated into a body region under examination.

The RF pulses emitted by an RF power amplifier device of a magnetic resonance tomography system are conducted, via a measurement device, to a transmission coil that radiates the RF pulses into the body region. The term "transmission coil" is used herein to refer to any antenna device by which the RF pulses can be radiated.

With the development and establishment of magnetic resonance tomography systems, limit values for ensuring patient safety have been standardized that regulate the maximum RF radiation into a human body. A typical limit value for this is the maximum permissible SAR (Specific Absorption Rate) value.

In order to maintain these limit values, a measurement device acquires measurement values that represent the radiated power of the RF pulses radiated by the transmit coil. On the basis of a number of power measurement values, power control values are formed. These power control values are then compared with a rigid power limit value predetermined by a standard, this limit value being selected such that the predetermined SAR limit value is not exceeded. The RF device is then automatically limited in its functioning if a control value exceeds the predetermined threshold value.

That is, conventionally the maximum permissible SAR is converted to a maximum permissible power, and this power limit value is monitored. The physiological effect of RF energy on a human or animal body depends, inter alia, on the frequency and on the type of coil, i.e., on whether the coil radiates in e.g. a circular or linear polarized fashion, or whether it is for example a volume coil or a surface coil. In addition, the effect also depends on the position of the coil in relation to the body of the patient. For these reasons, in the conventionally monitoring it has been necessary in part to work with large safety margins from the actual critical value, in order to be able to ensure 100% safety for the patient when fundamental parameters, such as for example the position, are changed. This results in the permissible power limit value in general being considerably lower than the value that is actually necessary to produce the maximum loading.

Because, as a rule, lower RF power also results in a lower image quality, it is desirable to reduce this excessive safety margin. It should also be noted that a lower image quality has the end result that exposures may not offer the desired diagnostic possibilities, or even that exposures may have to be retaken, resulting in a higher total of exposure to the patient.

Another problem in such known monitoring is that, due to the dimensioning of the tomography system, the window that is visible during a measurement, known as the field of view, is limited. In order to produce a whole-body exposure of a person in one measurement, the person must be moved through the magnet during the magnetic resonance measurement. That is, the person is moved relative to the RF field radiated by the transmission coil, hereinafter called the "transmission field." During this process, different body regions of the person are successively exposed to the RF radiation. The power radiated by the RF device therefore results in different specific absorption rates. That is, during the course of the measurement of a moving subject of examination, the absorption rates are not constant, contrary to the premise underlying conventional monitoring wherein the patient is situated in a particular position relative to the RF antenna during a measurement. Just as the specific absorption rate itself changes with the position of the subject of examination relative to the RF antenna, the SAR limit values also change with the patient position.

In conventional monitoring methods, neither current changes in the specific absorption rate nor current changes in the SAR limit values are able to be taken into account during the measurement.

In order to maintain the SAR limit values without the use of excessive safety margins, in DE 101 50 137 A1 and DE 101 50 138 A1 methods are proposed in which current SAR values that are to be expected are calculated before a measurement is carried out, on the basis of patient data, the position of the patient relative to the transmission antenna, and the planned measurement parameters. The parameters are then altered as necessary until the SAR values are within the SAR limit values. Here, the determination of the current SAR values takes place by a comparison of the current measurement situation with various measurement situations that are pre-specified in a database, for which SAR values calculated in advance are stored. As the current SAR value, the stored SAR value of the measurement situation that comes closest to the current measurement situation is used. Thus, in this method it is determined ahead of time, for the entire measurement, which RF power is permitted to be emitted to the patient at which point in time. In such a method, the controlling of the SAR value is not autonomous, but relies on instructions based on predictions of the measurement program that determines the pulse sequences for the measurement. Unforeseen events that, for various reasons, result in a sudden alteration in the measurement sequence cannot be taken into account. In particular, in this method it is not possible to move the patient through the tomograph during the measurement. An exposure of the whole body takes place by carrying out measurements at various fixed positions and later combining the image data from the various fields of view.

SUMMARY OF THE INVENTION

An object of the present invention is to provide a method for controlling an RF device that reliably prevents the radiated RF power from exceeding a limit value that is not dangerous to the patient, even for a subject of examination that is moving relative to the transmit field, while at the same time permitting this safe limit value to be approached as closely as possible, so that the measurement (data acquisition) can take place within the limit value with as high an RF transmission power as possible. A further object is to provide a corresponding magnetic resonance tomography system, as well as an RF control device, with which such a method can be implemented.

The present invention is based in part on the recognition that in the conventional method described above for controlling the RF device, unnecessarily large safety margins are often maintained due to the technical details of the measurement method. As explained above, this is a result of the method of converting the SAR limit value into a power limit value and then controlling the maintenance of the indicated power limit value. This power limit value is related only to one measurement position. At all other measurement positions, only a global increase of the safety margin takes place.

Taking advantage of this recognition, in accordance with the invention position values are determined, at chronological intervals, that represent a current position of the subject of examination relative to the transmit field, and, on the basis of these position values and the measurement values measured at the chronological intervals that represent a power value of the RF pulses, exposure values are determined that represent a physiological degree of effectiveness that the RF pulses have on the subject of examination.

Then, based on a multiplicity of exposure values, the exposure control values are formed, on the basis of which the actual monitoring finally takes place. The RF device is limited in its functioning if an exposure control value reaches or exceeds an exposure limit value.

In the method according to the present invention, a limitation of the functioning of the functioning of the RF device can, take place, for example, by switching off a transmission device, or an RF power amplifier device, or by deactivation from time to time of the relevant device, or a reduction of the transmit power.

In the method according to the present invention, for example the SAR limit value can be used immediately as the exposure limit value, as long as the exposure values, determined on the basis of the individual measurement values that represent the power of the RF pulses, are calculated in the form of momentary SAR exposure values. Using these momentary SAR exposure values, it is then possible, in a manner similar to that implemented conventionally for the power control values, to form the exposure control values, for example by averaging the exposure values over particular periods of time prescribed by regulations, and/or to integrate the exposure values, in order to form the exposure control value. A preferred embodiment for forming exposure control values is described in more detail below.

Preferably, in order to determine the position values a current position of an examination platform on which examination subject is positioned relative to the transmission field, is determined. It is then only necessary to determine ahead of time the position and orientation in which the subject of examination is situated on the examination platform. The position values for the current position of the examination platform can be transferred directly from the platform control unit. In this case, an additional measurement unit is not required. In a preferred alternative, however, suitable position measuring devices are situated on the platform, so that the actual position, rather than the target position, is always used as position data in the method according to the present invention. Possibilities for determining the position of the subject of examination relative to the examination platform are explained in more detail below.

Consequently, using this method, as the examination platform moves through the scanner the current, real exposure is determined and taken into account for each table position, and thus, ultimately, for each position of the subject of examination in the RF radiation field. This means that exposure limit value monitoring is correctly carried out not only for previously planned positions, but also for unforeseen positions, resulting, for example, from a manual alteration of the measurement sequence, or from a mechanical defect in the platform positioning, etc.

In an application of the present invention, the RF exposure of the patient within a magnetic resonance tomography system is to be monitored. Therefore, measurement values must be used that represent the power remaining in the transmission coil, or that represent the power radiated by the transmission coil, as accurately as possible. Preferably, therefore, the measurement values are based on the difference between the forward power emitted by a transmit device of the RF device to the transmission coil and the backward power coming back from the transmission coil.

Because measurement values that directly represent the power of the RF pulses emitted by the transmission device also indirectly represent the resultant power remaining in the transmission coil, it would in principle be possible, e.g. in a simpler exemplary embodiment, to use only the power emitted by the transmission device, or a corresponding measurement value.

The obtained measurement values preferably are used in pre-processed form for the further determination of the exposure values, i.e., for example after an analog/digital conversion and/or a conversion of effective voltages into the difference between the forward power and the backward power. The chronological spacings between the RF pulses and between the measurements can be the same or different.

A determination of the exposure values on the basis of the measurement values can be carried out relatively simply by multiplying the relevant measurement values by an effectiveness factor, these effectiveness factors being dependent on position. That is, the effectiveness factors depend either indirectly (via the platform position) or directly on the position of the subject of examination relative to the transmit field.

The position-dependent effectiveness factors in principle can be calculated during the measurement itself. Because the computing expense for determining the effectiveness factors is relatively high, however, the position-dependent effectiveness factors preferably are determined before the execution of the resonance measurement, and are stored for use during the measurement. It is then only required to determine the corresponding effectiveness factor on the basis of the given current position values, which indicate for example the exact platform position, and then to multiply this effectiveness factor by the current measurement values that represent the power of the RF pulses, in order to determine the exact current power value. If the effectiveness factors have been correspondingly selected, the momentary SAR value can be immediately determined at the relevant point in time by multiplying by the current measurement value. Consequently, in the method according to the present invention the measurement and monitoring chain is newly parameterized at the run time of the measurement, by selecting a position-dependent effectiveness factor.

The data that are required in order to enable the calculation of the absorption data, and thus the effectiveness factors, for various platform positions or orientations of the subject of examination on the examination platform preferably can be determined on the basis of preliminary magnetic resonance measurements, known as "prescans." Such a prescan can be used only to determine the respective position-dependent absorption, and can therefore be carried out with imprecise but very large safety margins with respect to the RF radiation.

In addition, the calculation of the effective factors can also take into account the frequency of the emitted RF pulses, the coil geometry, and certain patient parameters such as bodily build, height, weight, etc. For example, a suitable SAR factor can be easily determined by calculating the SAR exposure in the patient for a particular patient or a particular patient body type, a particular orientation and a particular geometric construction of the coil, a particular frequency, and a particular platform or patient position, and dividing the calculated exposure by the power.

If the RF radiation is radiated via a number of transmission paths, for example having different frequencies or via different transmission coils, different exposure values can be determined separately for the individual transmission paths. The respective measurement values representing the RF power are then multiplied by corresponding effectiveness factors for each transmit path. The exposure values of the individual transmit paths can be added or can be combined in some other way, e.g. by a weighted addition, in order to obtain an overall exposure value.

In principle, the effectiveness factor also can be determined dependent on other parameters. Thus, for example the maximum RF power that a patient can absorb without having to fear adverse health effects is dependent, inter alia, on various environmental parameters. Often, there is a direct connection between the maximum RF power and climate values, e.g. the temperature and/or air humidity in the patient's immediate environment, because these result in different momentary SAR exposure values at the same RF power. Such environmental parameters can be taken into account, in addition or alternatively, in the determination of the exposure limit values.

In the determination of the exposure control values from the exposure values, a time window preferably is considered that slides in the time domain over the measurement values, or over the exposure values determined therefrom. The exposure control values used for the comparison with an exposure limit value, which are in fact based on a multiplicity of measurement values or exposure values in the time window under consideration, in this way reflect, in a very relevant fashion, e.g. the actual radiation exposure of a patient in a magnetic resonance tomography system that has occurred in the time interval that has just passed.

In a preferred exemplary embodiment, monitoring of the exposure values (and thus of the RF power) takes place in various time windows that are interleaved; i.e., for example a short-term monitoring and a long-term monitoring are implemented. Here, respective exposure control values are determined simultaneously for a number of time windows having different lengths, preferably for two time windows of 10 s and 360 s, and these exposure control values are compared with exposure limit values that apply for the respective time periods. The RF device is then limited in its functioning if only one of the exposure control values reaches or exceeds the associated exposure limit value. This method is used to monitor the radiation of a particular higher dose over a longer time window, and simultaneously to ensure that all of the power permissible within the long time window that is to be monitored is not radiated onto the patient within a short time window, thus creating a danger for the patient due to the short-term excessive exposure.

In order to make it possible to operate independently of all timing rasters, the exposure control value can be produced from the sum of a multiplicity of exposure values, each of which are weighted with an interval length between the measurement of two successive measurement values. For example an exposure value is multiplied by the interval length between the previous measurement and the relevant measurement. In this way, the exposure values are integrated, in terms of area, in the time window that is to be observed, and for example an average exposure value is calculated therefrom.

The present invention also involves a magnetic resonance tomography system having an RF device for emanating RF pulses, a platform control unit to move an examination platform with an examination subject situated thereon, relative to a transmission field of the RF device during a magnetic resonance measurement, and having a measurement device for measuring measurement values that represent a power level of the radiated RF pulses, and having an RF control device that is coupled to the measurement device.

The RF control device, which can be realized as a processor device, is configured (preferably by programming) such that at chronological intervals measurement values are measured and position values are determined, and on the basis of the measurement values and position values exposure values are determined that represent a physiological effectiveness that the RF pulses have on the subject exposed to the RF pulses. In addition, the RF control device is configured to form exposure control values on the basis of a multiplicity of exposure values, and the RF device is then limited in its functioning if the exposure control value reaches or exceeds an exposure limit value.

In addition, the magnetic resonance tomography system includes all other standard components, such as e.g. a magnet system for producing a magnetic field, a gradient system having a number of gradient coils for applying magnetic field gradients, and an RF reception system (e.g. as a part of the RF device) having reception coils, a suitable reception amplifier, and an image computer. The transmission coils can also be used as the reception coils.

Also within the scope of the present invention is a corresponding RF control device having a measurement value input for the measurement values, a position value input for the position values, and a control signal output for control signals. The RF control device is configured such that at chronological intervals measurement values are measured and position values are determined, and on the basis of the measurement values and position values corresponding exposure values are determined that represent a physiological effectiveness that the RF pulses have on a subject exposed to the RF pulses. In addition, the RF control device ensures that, based on the sum of a multiplicity of exposure values, exposure control values are formed, and that a control signal that effects the limitation of the functioning of the RF device is outputted at the control signal output if an exposure control value reaches or exceeds an exposure limit value.

DESCRIPTION OF THE PREFERRED EMBODIMENTS

Figure 1:
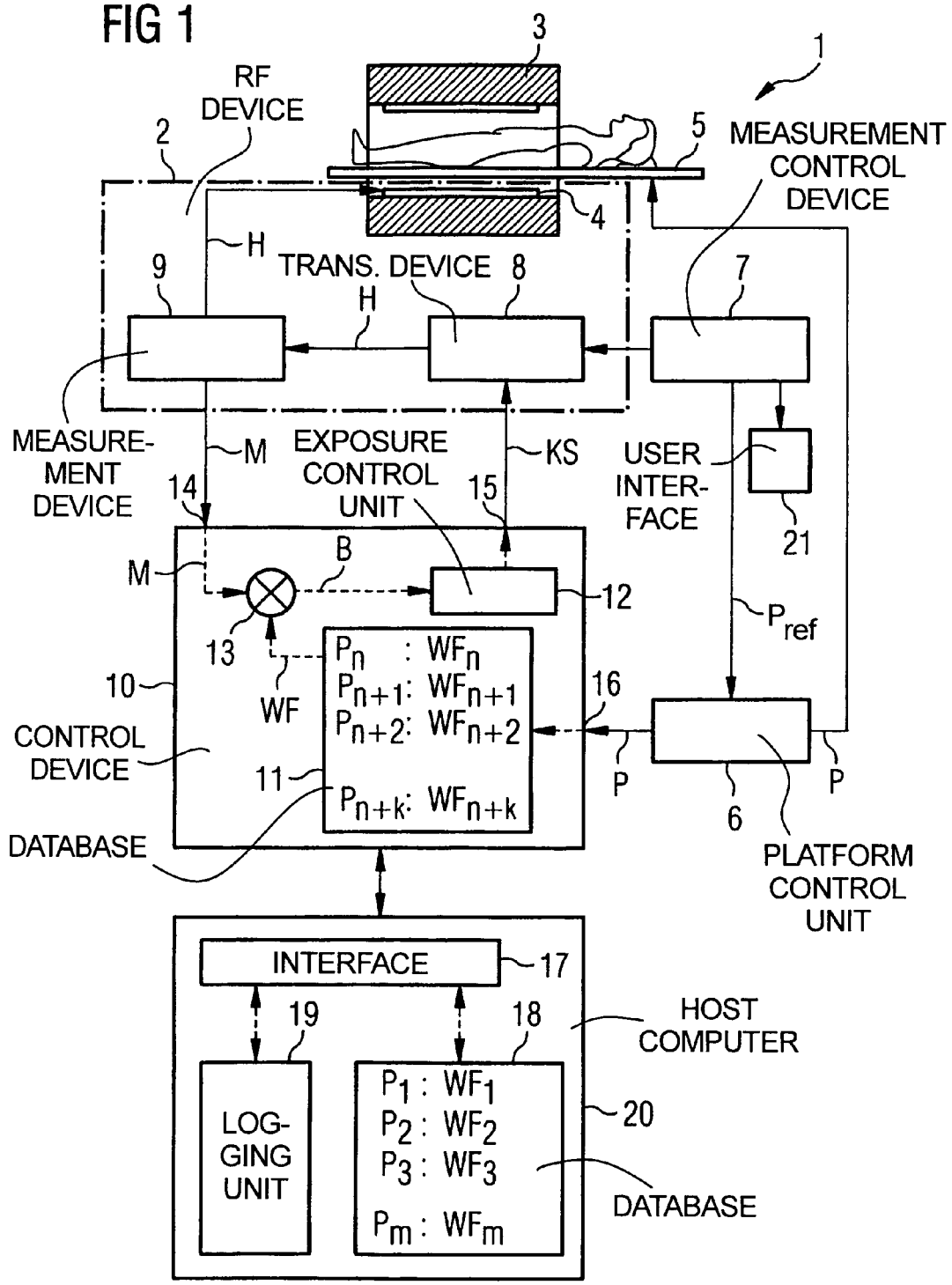
FIG. 1 schematically illustrates a magnetic resonance tomography system according to the present invention.

FIG. 1 schematically shows the basic components of a magnetic resonance tomography system 1 for explaining the present invention. These include the MR scanner, having a basic field magnet 3, as well as an RF transmission/reception antenna 4. In the following, this RF antenna 4 is referred to for short as a transmission coil 4, because the present invention relates to the monitoring of the radiated RF power. Such a transmission coil 4, which surrounds the entire measurement space of the scanner, is standard also designated a whole-body coil or body coil. It can be constructed, for example, in the manner of an antenna type known as a birdcage antenna. Within the measurement space surrounded by the transmission coil 4, in which the transmission field essentially extends, there is situated an examination platform 5 on which an examination subject O, i.e., the patient, can be positioned. Via a drive system (not shown), platform 5 can be moved through the tomograph along the longitudinal axis of the tomograph, or of transmit coil 4. The controlling of this drive system for platform 5 takes place using a platform control unit 6.

Another important component of such a magnetic resonance tomography system 1 is an RF device 2; the representation shown here concentrates on the transmission branch of RF device 2. Besides the transmit branch of RF device 2, the magnetic resonance tomography system also has an RF reception system (not shown) having at least one reception coil and a suitable reception amplifier; here, the RF antenna 4 from which the RF pulses are radiated can also be used as such a reception antenna. Additionally or alternatively, local coils, such as for example a head coil or additional flat coils placed on body parts of the patient that are to be examined, can be used. An image computer reconstructs the images from the received signals in order to display the images on, for example, a display screen, and/or to permit them to be stored in a memory device. Moreover, the magnetic resonance tomography system also has a system (also not shown) of gradient coils that are situated inside the scanner and with which one or more magnetic field gradients can be applied to the examination subject O.

A measurement control unit 7 is used to coordinate the operation of the individual components.

Besides the transmission coil 4, RF device 2 has a transmission device 8 having an RF power amplifier device (not shown) that radiates RF pulses H in a power range between 10 W and 20 kW.

This transmission device 8 is controlled by the measurement control unit 7. This unit 7 can be controlled in a standard manner by an operator via a user interface 21 having a monitor, keyboard, mouse, etc. In measurement control device 7, among other things the sequence of the individual measurements is controlled on the basis of predetermined measurement protocols, and, besides the radiating of RF pulses H by transmission device 8, the switching of basic field magnet 3 and of the magnetic field gradients (not shown) at the scanner are controlled in a manner suitable for carrying out the desired measurements.

From the transmission device 8, RF pulses H are conducted to a measurement device 9 via a cable. From the measurement device 9, RF pulses H are forwarded to the RF antenna 4 of the scanner. From the RF antenna 4, RF pulses H are then radiated into a body region of the examination subject O, who is positioned within the RF antenna 4 on the examination platform 5.

The measurement device 9 is here realized as a sensor, in particular a sensor of the type known as a transmission antenna level sensor (TALES), and has directional couplers for decoupling a small part of the forward power emitted by the transmission device 8 to the RF antenna 4 and a small part of the reflected power coming back from the RF antenna 4. Each measured power is converted into an effective voltage. The RF voltages measured in this way can be between 0 and 1000 volts. The measured values are supplied by the measurement device 9 to an RF control device 10, also called a PALI (Power Amplifier Limiter), via a measurement value input 14, possibly after an analog/digital conversion and other pre-processing, if required.

The RF control device 10 has a processor device, including a digital signal processor. The schematic design of this device 10 can also be seen in FIG. 1.

At particular time intervals, for example intervals of 20 μs, the measured voltage values are converted into the resultant power remaining in the RF antenna 4 of the magnetic resonance scanner by subtracting the reflected power from the incoming power, i.e. the forward power. That is, at fixed time intervals of 20 μs measurement values M for the RF control device 10 are acquired. This pre-processing of the voltage values to form the actually desired measurement values M here takes place in the measurement device 9. Alternatively, this can take place through an interface at the measurement value input 14, or can first take place in the RF control device 10.

Via an additional signal input 16, position values P are supplied to the RF control device 10 directly from the platform control unit 6; these values indicating the position of the platform 5 relative to the transmission coil 4. Alternatively, position values P can be transferred from a measurement device on the platform 5, or can be obtained immediately from position target values $P_{Ref}$, which are given to the platform control unit 6 by the measurement control unit 7. In this way, the platform position can be determined precisely to the millimeter. Conventionally, the rate of platform advance is up to about 20 cm/s.

In a database 11, position-dependent effectiveness factors $WF_n$ to $WF_{n+k}$ are stored for each of various possible position values $P_n$ to $P_{n+k}$. In a logic unit 13 of the RF control device 10, the current measurement values M are multiplied by the associated effectiveness factors WF dependent on the current platform position, in order to immediately convert the measurement values M, which represent the radiated transmit power, into an SAR exposure value B. This is shown schematically in FIG. 1. Exposure values B are then provided to an exposure control unit 12, whose functioning is explained below.

The respective effectiveness factors $WF_n$ to $WF_{n+k}$ for the various position data $P_n$ to $P_{n+k}$ are determined before the actual measurement. For this purpose, a prescan is carried out in which a complete exposure of the patient is produced with relatively large safety margins, i.e., with low RF power.

On the basis of the measurement values obtained in this way, the associated effectiveness factor can be determined for each position.

Figure 2:
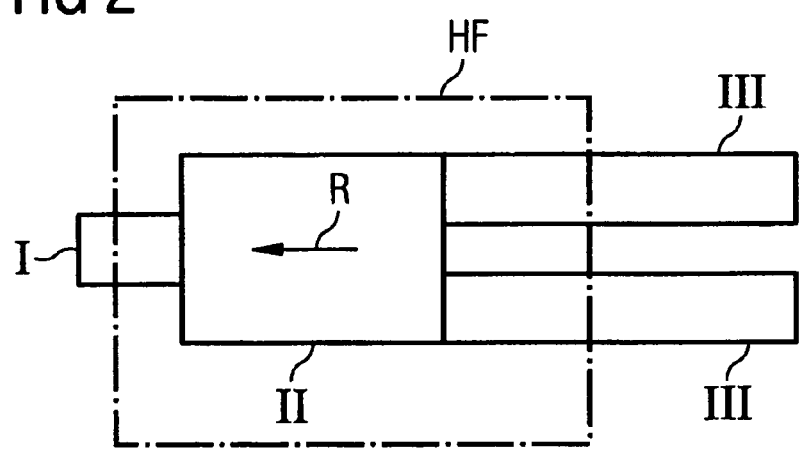
FIG. 2 is a representation of a cylinder model for use in a calculation of the aspect factors for determining the SAR exposure dependent on the radiated transmit power.

For such a preliminary calculation of an individual effectiveness factor WF at a particular position value P, first a radiated power level can be assumed, and an SAR value resulting from this radiated RF power can then be calculated. This can take place using what are known as "aspect factors," which indicate how much SAR exposure arises for a particular aspect from the radiated transmit power, or which electrical field is induced in the body of the patient by a transmission power radiated in a particular manner. Current standards provide various aspects, such as for example a whole-body aspect, a head aspect, and an exposed partial-body aspect. In order to calculate the absorbed power, for example a cylinder model can be used, in which the patient is modeled by four homogenous cylinders: a head cylinder I, a torso cylinder II, and two leg cylinders III, as is shown schematically in FIG. 2. The movement of the body through the radio-frequency field RF is indicated by the directional arrow R. Using Maxwell's equations, the individual absorption rates of the cylinders in the external homogenous radio-frequency field RF can be calculated. Here, the irradiation of the patient, i.e., the extent to which the respective cylinder model is exposed to the radiation, is also to be taken into account. This information results, for example, from the prescan. This simple model can be refined with the aid of simulation calculation and the absorption data obtained from the prescan. The total absorption then results from the sum of the individual absorption levels. Finally, the respective SAR exposure can be calculated from the absorption divided by the corresponding partial-body mass. To this extent, the distribution by percent of the absorbed power among the various aspects can also be determined. In principle, however, such calculating methods are known to those skilled in the art. Calculating methods for power absorption are described, for example, by Paul A. Bottomley, et al., in "Estimating Radiofrequency Power Deposition in Body NMR Imaging," Magnetic Resonance in Medicine 2, 1985, pp. 336–349. In addition, simulation programs are commercially available with which simple models can be monitored. Because the SAR exposure also depends on the body mass, this calculation must be carried out for each individual patient, if it is to be very precise. In principle, however, it is sufficient if particular patient types are defined that are specified by their body size and mass, and then a corresponding predefined value is selected for a patient of the corresponding type, taking into account, for example, the prescan data. This can save significant computing expense.

The times at which the measurement values M are obtained and at which the platform position values P are transferred need not necessarily coincide. For a measurement value M, it is always possible for example to use the last-determined position value P. In principle, it is also not required to calculate a specific effectiveness factor for each precise determined position value P; rather, it is sufficient if effectiveness factors are determined for the platform position values in a sufficiently narrow raster distance. If a position value P given to RF control device 10 by the platform control unit 6 lies between two "raster position values" $P_n$ to $P_{n+k}$ for which effectiveness factors $WF_n$ to $WF_{n+k}$ are present in database 11, then either interpolation can take place between adjacent raster position values $P_n$ to $P_{n+k}$ in order to determine the effectiveness factor WF belonging to the current position value P, or, for example, the effectiveness factor $WF_n$ to $WF_{n+k}$ of the preceding or following raster position value $P_n$ to $P_{n+k}$ is used. To produce sufficient precision in such a method, the raster having raster position values $P_n$ to $P_{n+k}$ for which respective effectiveness factors $WF_n$ to $WF_{n+k}$ are determined must be sufficiently fine. In initial test measurements, a raster dimension of 3 cm has turned out to be particularly suitable. That is, a very large number of effectiveness factors must be determined.

Because the calculation of the effectiveness factors for each individual raster position value is relatively computationally-intensive, this calculation preferably takes place on a host computer 20 to which the RF control device 10 is connected. In the exemplary embodiment shown in FIG. 1, the host computer 20 calculates effectiveness factors $WF_1$ to $WF_m$ for all raster position values $P_1$ to $P_m$ achieved during the measurement, and stores them in a database 18 installed at the host computer 20. A database 11 situated in RF control device 10 is then supplied only with those effectiveness factors $WF_n$ to $WF_{n+k}$ for respective raster position values $P_n$ to $P_{n+k}$ that are required for the current position values P, i.e., that are situated in the area of the current position. A timely updating of the values in the database 11 of the RF control device 10 takes place via an interface 17 in the host computer 20. For this purpose, the current platform position P is regularly communicated to the host computer 20 by the RF control device 10. In addition, the RF control device 10 can communicate the energy transmitted since the last measurement data report and the exact time, in order to log the overall measurement sequence and the current SAR exposure B in a logging unit 19 of the host computer 20.

Figure 3:
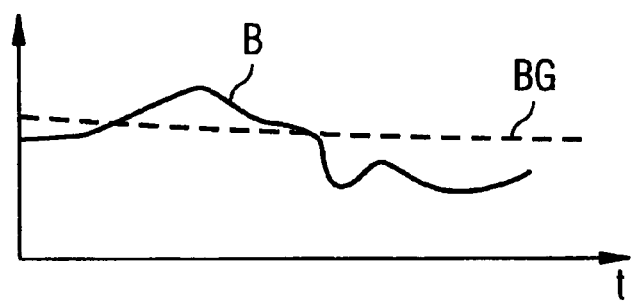
FIG. 3 is a diagram illustrating an example of the possible curve of the momentary overall exposure and the exposure limit value.

FIG. 3 shows, only as an example, a schematic representation of a possible curve of the momentary SAR exposure B, plotted over a time axis t. For comparison, the exposure limit value BG (here the SAR limit) is also shown, which likewise can change with time (though generally it does so slowly), for example due to changes in the (climatic) environmental parameters at the scanner.

As shown in FIG. 3, the momentary exposure value B may briefly exceed the exposure limit value BG somewhat. However, it must be ensured that this exposure value B does not on average (with respect to predetermined time intervals of e.g. 10 s and/or 360 s) exceed exposure limit value BG—here, the SAR limit BG prescribed by regulations.

For this purpose, as mentioned above, the momentary exposure values B are given to an exposure control unit 12 that is responsible for maintaining the limit values under the existing conditions.

Figure 4:
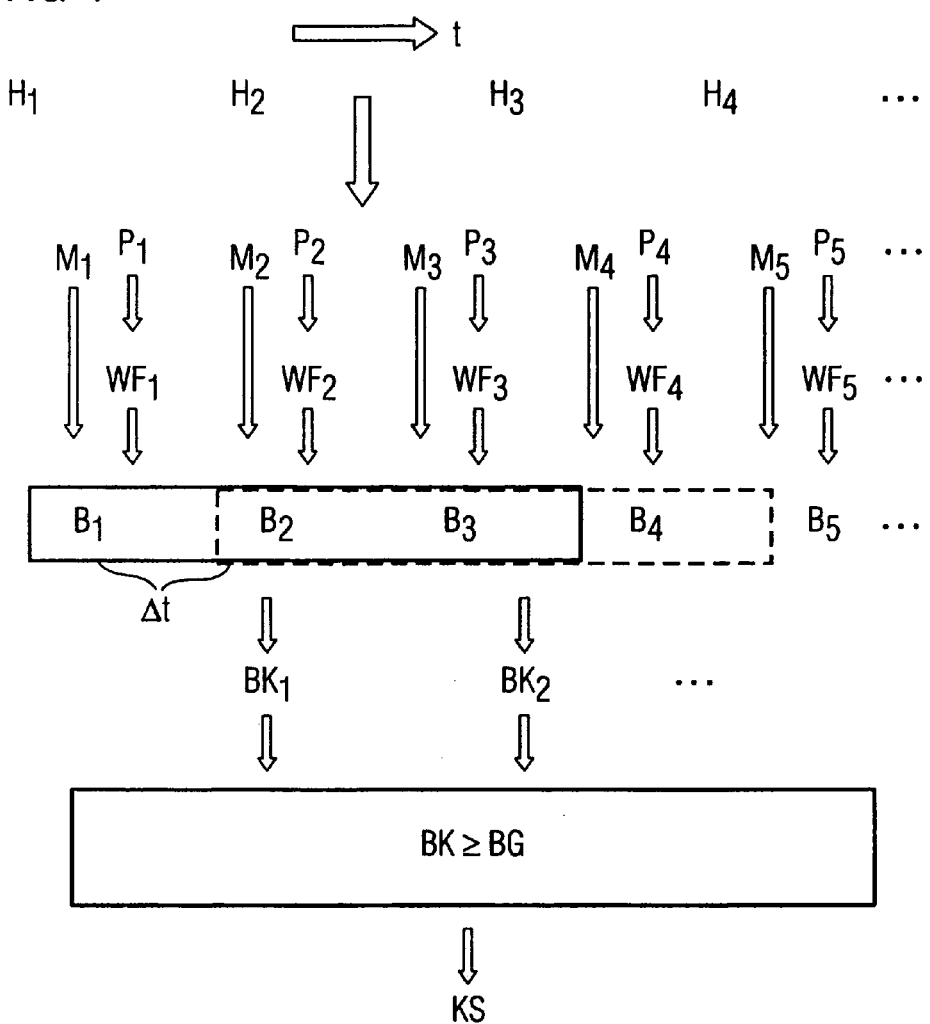
FIG. 4 is a simplified flowchart for an embodiment of a method for controlling an RF device in accordance with the invention.

FIG. 4 shows a simplified flowchart of an exemplary embodiment of the method according to the present invention. First, along a time axis t a number of RF pulses $H_i$, i=1,2,3,4, . . . are shown that are emitted by transmit device 8. Beneath this, measurement values Mi, i=1,2,3,4,5, . . . are shown, also along time axis t, that represent the power level of RF pulses H. Generally, a number of measurement values M are taken for each RF pulse H.

Moreover, at various points in time, which can agree with the recording of the measurement values but need not do so, position values $P_i$, i=1,2,3,4,5, . . . are determined. On the basis of these position values $P_i$, position-dependent effectiveness factors $WF_i$, i=1,2,3,4,5, . . . are then determined. Using these current effectiveness factors $WF_i$, the valid measurement values Mi are then each converted into exposure values $B_i$, i=1,2,3,4,5, . . . .

Through a window Δt that slides over exposure values B in the time domain, a multiplicity of exposure values B is selected, and each is further processed to form a control value BK. Thus, here the values $B_1$, $B_2$, $B_3$ are processed to form a first exposure control value $BK_1$. Likewise, a short time later measurement values $B_2$, $B_3$, $B_4$ are selected by sliding time window Δt and are further processed to form exposure control value $BK_2$. The length of window Δt is preferably 10 seconds or 360 seconds. Particularly preferably, a short-term monitoring takes place, e.g. with a 10-second window, and a long-term monitoring takes place, e.g. with a 360-second window.

In this example, control value BK is respectively determined from the selected multiplicity of exposure values B by forming the average value of the selected exposure values B. In order only to simplify the representation, here the selected multiplicity of exposure values B includes only three values. Depending on the realization of the present invention, this multiplicity can include arbitrarily many values.

In a further processing step, the exposure control values BK are compared with an exposure limit value BG that is predetermined by a standard (regulation). Here, the exposure limit values can be determined by a standard dependent on the body weight of the respective patient. If it should turn out that an exposure control value BK is greater than or equal to an exposure limit value BG, a control signal KS is emitted. This control signal KS of the exposure control unit 12 is then forwarded via a control output 15 to the transmission device 8, so that the transmission device 8, or the RF power amplifier device contained therein, is at least partially or temporarily deactivated.

It should again be emphasized that the method described in detail above, as well as the represented RF system and RF control device, are exemplary embodiments that can be modified by a person skilled in the art in a wide variety of ways without exceeding the scope of the present invention. In particular, the acquisition of the power measurement values can also take place differently than in the form presented above. Although the present invention has been described above in relation to the example of a magnetic resonance tomography system in the field of medicine, the present invention can be used in other areas of application, such as in magnetic resonance tomography systems used in scientific and/or industrial applications.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for controlling an RF device of a magnetic resonance tomography system during acquisition of magnetic resonance data from an examination subject that is moving relative to a transmission field radiated by said RF device, comprising the steps of:
    radiating RF pulses from said RF device at chronological intervals;
    acquiring measurement values respectively representing a power level of said RF pulses at chronological intervals;
    obtaining position values representing a current position of said examination subject relative to said transmission field at chronological intervals;
    automatically electronically determining exposure values, representing a physiological degree of effectiveness of said RF pulses on said examination subject, from said measurement values and said position values;
    automatically electronically calculating exposure control values based on a plurality of said exposure values; and
    limiting functioning of said RF device if one of said exposure control values equals or exceeds an exposure limit value.

2. A method as claimed in claim 1 comprising moving said examination subject on an examination platform relative to said transmission field, and determining said position values by determining respective position values of said examination platform relative to said transmission field.

3. A method as claimed in claim 1 comprising automatically electronically determining said exposure values by multiplying the measurement value for an associated position value with a position-dependent effectiveness factor for that position value.

4. A method as claimed in claim 3 comprising determining respective position-dependent effectiveness factors before acquiring said magnetic resonance data, and storing the acquired position-dependent effectiveness, factors for use during said acquisition of magnetic resonance data.

5. A method as claimed in claim 4 comprising determining said position-dependent effectiveness factors in a preliminary magnetic resonance measurement conducted before acquisition of said magnetic resonance data.

6. A method as claimed in claim 1 comprising automatically electronically determining each exposure control value as a sum of a plurality of exposure values within a predetermined time window.

7. A method as claimed in claim 6 comprising weighting the respective exposure values in said time window with an interval length between measurements of two successive ones of said measurement values.

8. A method as claimed in claim 6 comprising sliding said time window over said measurement values in the time domain.

9. A magnetic resonance tomography system comprising an RF device of a magnetic resonance tomography system during acquisition of magnetic resonance data from an examination subject that is moving relative to a transmission field radiated by said RF device, comprising:
    an RF device that radiates RF pulses at chronological intervals;
    a patient platform, adapted to receive a patient therein to move said patient relative to said RF device;
    a power level measurement unit that acquires measurement values respectively representing a power level of said RF pulses at chronological intervals;
    a position detector that obtains position values representing a current position of said examination subject relative to said RF device at chronological intervals; and
    a control unit that determines exposure values, representing a physiological degree of effectiveness of said RF pulses on said examination subject, from said measurement values and said position values, and calculates exposure control values based on a plurality of said exposure values, and limits functioning of said RF device if one of said exposure control values equals or exceeds an exposure limit value.

10. A control device for controlling an RF device of a magnetic resonance tomography system during acquisition of magnetic resonance data from an examination subject that is moving relative to a transmission field radiated by said RF device, with RF pulses being radiated from said RF device at chronological intervals, and measurement values respectively representing a power level of said RF pulses at chronological intervals, and position values being obtained representing a current position of said examination subject relative to said transmission field at chronological intervals, said control device comprising:
    an evaluated unit that determines exposure values, representing a physiological degree of effectiveness of said RF pulses on said examination subject, from said measurement values and said position values; and
    a control unit that calculates exposure control values based on a plurality of said exposure values, and limits functioning of said RF device if one of said exposure control values equals or exceeds an exposure limit value.

* * * * *